US005198703A

United States Patent [19]
Colles

[11] Patent Number: 5,198,703
[45] Date of Patent: Mar. 30, 1993

[54] SYSTEM FOR DETECTING VOLTAGE PULSES OF A PARTICULAR MAGNITUDE

[75] Inventor: Joseph H. Colles, Oceanside, Calif.

[73] Assignee: Brooktree Corporation, San Diego, Calif.

[21] Appl. No.: 802,072

[22] Filed: Dec. 3, 1991

Related U.S. Application Data

[63] Continuation of Ser. No. 583,440, Sep. 17, 1990, abandoned, which is a continuation of Ser. No. 333,416, Apr. 3, 1989, abandoned.

[51] Int. Cl.5 ............... H03K 5/153; H04N 5/08
[52] U.S. Cl. ................... 307/350; 307/354; 307/363; 307/548; 307/562; 328/139; 358/153
[58] Field of Search ............... 307/350, 354, 360, 363, 307/546, 548, 553, 555, 562, 568; 328/139; 358/148, 153

[56] References Cited

U.S. PATENT DOCUMENTS

| | | | |
|---|---|---|---|
| 3,629,501 | 12/1971 | Cense | 328/139 |
| 4,081,833 | 3/1978 | Akiyama | 358/153 |
| 4,580,166 | 4/1986 | Okano | 328/139 |
| 4,635,115 | 1/1987 | Kamiya | 358/153 |

FOREIGN PATENT DOCUMENTS 0079578  6/1981  Japan .................. 358/153

*Primary Examiner*—John Zazworsky
*Attorney, Agent, or Firm*—Ellsworth R. Roston; Charles H. Schwartz

[57] ABSTRACT

First circuitry on an integrated circuit chip has an input terminal, preferably the only input terminal, for receiving a voltage pulse introduced to a first terminal on the chip. The first circuitry damps the negative voltage peaks of the voltage pulse at a voltage of a first magnitude inherent in the construction of the first circuitry. A pair of input transistors in the first circuitry have dimensions to provide, at the input terminal to second circuitry, a clamping voltage of a first magnitude at a certain fraction of the power supply voltage. The first circuitry may include a closed loop servo amplifier which regulates the negative peaks of the pulse at the input terminal to the second circuitry to a value approximately equal to the voltage of the first magnitude. The second circuitry compares the negative peaks of the input voltage pulse with a voltage of a second magnitude inherent in the construction of the second circuitry to provide an output logic pulse. A pair of input transistors in the second circuitry have dimensions to provide an internal reference voltage of the second magnitude. Differences between the dimensions of the input transistors in the second circuitry and the first circuitry provide a slight but accurate difference between the voltages of second and first magnitudes. The output pulse may constitute a horizontal sync pulse having amplitude not slightly more negative than the negative peaks of a color burst following it. This pulse provides for a faithful reproduction of color from color information signals following the color burst signals.

30 Claims, 1 Drawing Sheet

SYSTEM FOR DETECTING VOLTAGE PULSES OF A PARTICULAR MAGNITUDE

This is a continuation of application Ser. No. 583,440 (now abandoned) filed Sep. 17, 1990, which abandoned application is in turn a continuation of application Ser. No. 333,416 (now abandoned) filed Apr. 3, 1990.

This invention relates to a system for detecting a voltage pulse at a particular amplitude level to provide a distinction between such voltage pulse and signals following such voltage pulse. More particularly, the invention relates to a system for detecting a horizontal sync pulse at a particular amplitude level and rejecting the color burst and video signals following the horizontal sync pulse.

Color television systems provide an image raster consisting of a plurality of horizontal lines in a video display screen. These horizontal lines are vertically displaced by a particular distance from one another. The successive horizontal lines are intended to be vertically aligned with one another to provide a faithful reproduction of the image on the video display screen. This alignment is made possible by providing a horizontal sync pulse before the beginning of each line. Since each of these horizontal sync pulses occurs at a predetermined time before the beginning of the associated line, the successive horizontal lines should become precisely aligned vertically to provide for a faithful reproduction when the horizontal sync pulses are detected with precision.

The color television systems now in use provide color burst signals in each horizontal line after the horizontal sync pulse. The color burst signals are provided in each horizontal line to synchronize the reproduction of the color video signals which follow the color burst signal in each line. The color burst signals follow immediately in each line after the horizontal sync pulse and are sinusoidal in nature, with positive and negative peaks.

Since the horizontal sync pulse is a negative pulse, it is sometimes difficult to distinguish in each line from an amplitide standpoint between the negative peak amplitude of the horizontal sync pulse and the negative peak amplitude of the color burst signals. Should a negative sync pulse not be detected, or should the negative peak of the color burst signal be falsely detected as a sync pulse, the resulting timing error will prevent the horizontal lines in the color image reproduced on the video display screen from being precisely aligned vertically. This will cause distortions to be produced in the video image on the television screen.

Various circuits have been provided in the prior art for distinguishing between the horizontal sync pulse and the color burst signals in each line to provide a precise timing for the production of the color image in each horizontal line. These circuits of the prior art have generally been complex and have required precision components. One difficulty has been that a reference voltage of a precise value has had to be provided to a precision comparator to provide for a reliable detection of the negative sync signal and a reliable rejection of the negative color burst peaks. The difficulty has resulted from the fact that both the voltage reference and the comparator have had to have precise characteristics and such characteristics have required precision components available only through the use of bipolar integrated circuit fabrication technology. As a result, the circuitry of the prior art has generally suffered from the higher power and larger circuit area required for integration in bipolar, as compared to CMOS, technology.

A considerable effort has been made, and significant amounts of money have been expended, to provide a system which will overcome the disadvantages discussed in the previous paragraph. In spite of such effort and such expenditures of money, the disadvantages discussed in the previous paragraph still persist. Actually, if anything, the problems have become aggravated because the circuits provided to overcome the problems have become increasingly complex.

This invention provides a system which overcomes the difficulties discussed above. The system of this invention does not use any reference voltage for purposes of comparison in amplitude with the horizontal sync pulse. The system of this invention also does not use a conventional comparator with both signal and reference inputs. Instead, the system employs an integrated circuit chip with transistors whose dimensions are tailored relative to each other. Because of these tailored dimensions, the transistors respond to the horizontal sync pulses by producing output pulses with negative polarities and with voltage magnitudes distinguishing between the horizontal sync pulses and the color burst signals in each horizontal line.

In one embodiment of the invention, a voltage pulse is introduced to a first terminal on an integrated circuit chip. First circuitry on the chip has an input terminal, preferably the only input terminal, for receiving the voltage pulse. The first circuitry functions to clamp the negative peaks of the voltage pulse at a voltage of a first magnitude inherent in the construction of the first circuitry and to provide such a clamped voltage pulse at the input to the second circuitry. A pair of input transistors in the first circuitry have dimensions to provide the clamping of the negative peaks of the pulse at the voltage of the first magnitude. The first circuitry may include a closed loop servo which provides the clamping action at the input terminal of the first circuitry.

Second circuitry on the chip has an input terminal common with the input terminal in the first circuitry. The second circuitry has an internal threshold with a voltage of a second magnitude inherent in the construction of the second circuitry. The second circuitry has a pair of input transistors which establish the threshold voltage of the second magnitude. If the pair of input transistors in the second circuitry were substantially identical to the input pair of the first circuitry, the threshold voltage of the second magnitude would be substantially identical to the clamping voltage of the first magnitude in the first circuitry. If one of the dimensions of one of the transistors in the second pair was changed slightly from the dimensions in the first pair, the threshold voltage of the second magnitude may be moved slightly upwardly from the clamping voltage of first magnitude in the the first circuitry.

The output pulse may constitute a horizontal sync pulse which results from an input pulse having a peak amplitude slightly more negative than the threshold voltage of the second circuitry. No output pulse would result from the color burst signals if their negative peak amplitude were slightly more positive than this threshold. This threshold may be used for purposes different from the production of the horizontal sync pulse. For example, the output pulse may be used in any application where a pulse of a particular magnitude has to be detected, and pulses of a slightly different magnitude have to be rejected.

Figure 4:
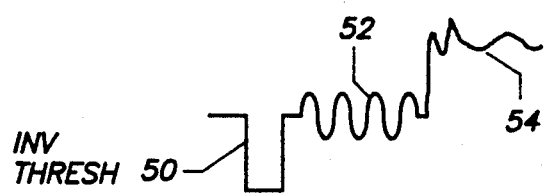
FIG. 4 illustrates the waveform of a typical composite color video signal.

In one embodiment of the invention, an integrated circuit chip generally indicated at 10 is provided. Circuitry generally indicated at 12 is disposed on the integrated circuit chip 10 to constitute one embodiment of the invention. The circuitry 12 includes a line 14 for receiving electrical signals such as indicated in FIG. 4. A capacitance 16 is in series with the line 14 and a common terminal 18. A resistance 20 is disposed electrically between the terminal 18 and a reference voltage level such as a ground 22.

The input terminal of an inverter 24 is common with the terminal 18. An N channel transistor 25 (FIG. 2A) in the N and P channel transistor pair in the inverter 24 may have individual dimensions such as a length of approximately five (5) microns and a width of approximately fifth (50) microns. Inverters 26, 28 and 30 are in turn in series with the inverter 24 and with one another. Each of the inverters 26, 28 and 30 has a transistor, preferably with common dimensions such as a length of approximately five (5) microns and a width of approximately fifth (50) microns. All of the inverters 24, 26, 28 and 30 are disposed on the integrated circuit chip 10, preferably in adjacent relationship to one another.

The output from the inverter 30 is introduced to the gate of a transistor 32 connected in a closed loop servo with the inverters 24, 26, 28 and 30 and with the common terminal 18. The source of the transistor 32 receives a suitable energizing voltage, such as a voltage of approximately five (5) volts, from a power supply 34. The transistor 32 may be a p type of transistor. The drain of the transistor 32 is common with the terminal 18.

The terminal 18 is also common with the input of an inverter 36. The inverter 36 includes an N channel transistor 37 (FIG. 2B) in the N and P channel transistor pair with individual dimensions such as a length of approximately five (5) microns and a width of approximately forth five (45) microns. This transistor should be located preferably in adjacent relationship to the inverter 24 on the integrated circuit chip 10. Inverters 38, 40 and 42 are in series between the output of the inverter 36 and an output line 44. Each of the inverters 38, 40 and 42 has a transistor, preferably with common dimensions such as a length of approximately five (5) microns and a width of approximately fifty (50) microns.

FIG. 4 illustrates the waveforms of the composite video signals produced in a single horizontal line of a raster scan. The signal waveforms include a horizontal sync pulse 50, color burst signals 52 (preferably constituting sinusoidal signals) following the horizontal sync pulse and signals 54 following the color burst 52 and representing the color video information in the line. The horizontal sync pulse 50 indicates the beginning of a horizontal line in a raster scan. The color burst signals 52 constitute a plurality of signals for regulating the colors represented by the color video signals 54. The color video signals 54 represent the colors and intensities to be produced in the successive positions in the horizontal line on a television screen.

The horizontal sync pulse 50 is introduced to the line 14. The capacitance 16 and the resistance 20 provide a high pass filter which passes the AC component of the composite video signals and blocks the DC component. The composite video signals are then introduced to the input of the inverter 24. Because of the individual dimensions (and particularly the width) of the N channel transistor in the CMOS inverter 24, the inverter 24 operates like a high gain differential amplifier where the input is amplified with respect to an internal difference voltage that is a certain fraction of the supply voltage. That fraction is established by the geometries of the N and P channel MOS transistor pair in the inverter, and therefore the fraction can be modified by altering the width of the N channel device.

The width of the N channel device is dimensioned such that the output of the inverter will be at approximately on half the 5 volt supply voltage when the input is approximately one half the supply voltage. Should the negative peak of the synchronization signal fall below one half of the supply voltage, the resulting positive voltage, at the output of the inverter 24 would be inverted three (3) successive times in the inverters 26, 28 and 30 so that a large negative voltage pulse is produced at the output of the inverter 30 and introduced to the gate of the transistor 32.

The conductivity of the transistor 32 is dependent upon the voltage introduced to the gate of the transistor. When a negative voltage pulse is introduced to the gate of the transistor 32, the current through the transistor increases. This causes the voltage on the drain of the transistor 32 to increase to counteract the negative voltage introduced to the terminal 18 from the input line 14. In this way, the negative peak voltage on the terminal 18 is regulated in a closed loop to have a substantially constant value such as one half of the 5 volt supply, or substantially two and one half volts (2.5 V.). No clamping action caused by current flow through the transistor 32 results when the voltage at the terminal 18 is greater (more positive than) than two and one half volts (2.5 V.) because the resulting positive voltage pulse produced by the inverter 30 causes the transistor 32 to become non-conductive.

The voltage on the common terminal 18 is introduced to the input terminal of the inverter 36. The inverter 36 has an N channel transistor with dimensions chosen so that the inverter functions as a difference amplifier where the input is amplified with respect to an internal difference voltage that is slightly more positive than that of the inverter 24. The inverter 36 therefore sees a sync pulse peak as a negative voltage pulse as a practical matter and produces a positive pulse at its output. The inverters 38, 40 and 42 in turn invert and greatly amplify the pulses introduced to their input terminals. The inverter 42 accordingly produces a full amplitude (5 V.) negative voltage pulse on the line 44. Because the negative peaks of the color burst signals 52 are more positive than the internal difference voltage of the inverter 36, the amplified output of the inverter chain 36, 38, 40, 42 remains positive. In this manner, the negative sync signal 50 is distinguished relative to the color burst signals 52 so that the color information in the successive horizontal lines can be precisely aligned vertically to obtain a faithful reproduction of a color image on a television screen.

Figure 1:
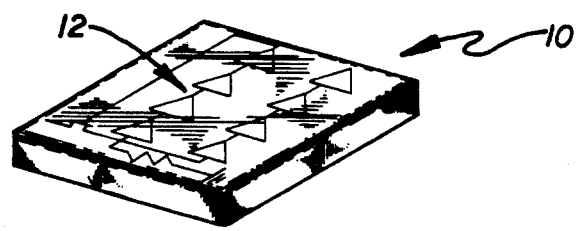
FIG. 1 is a schematic perspective view of an integrated circuit chip and of the system of this invention on the chip.
Figure 2:
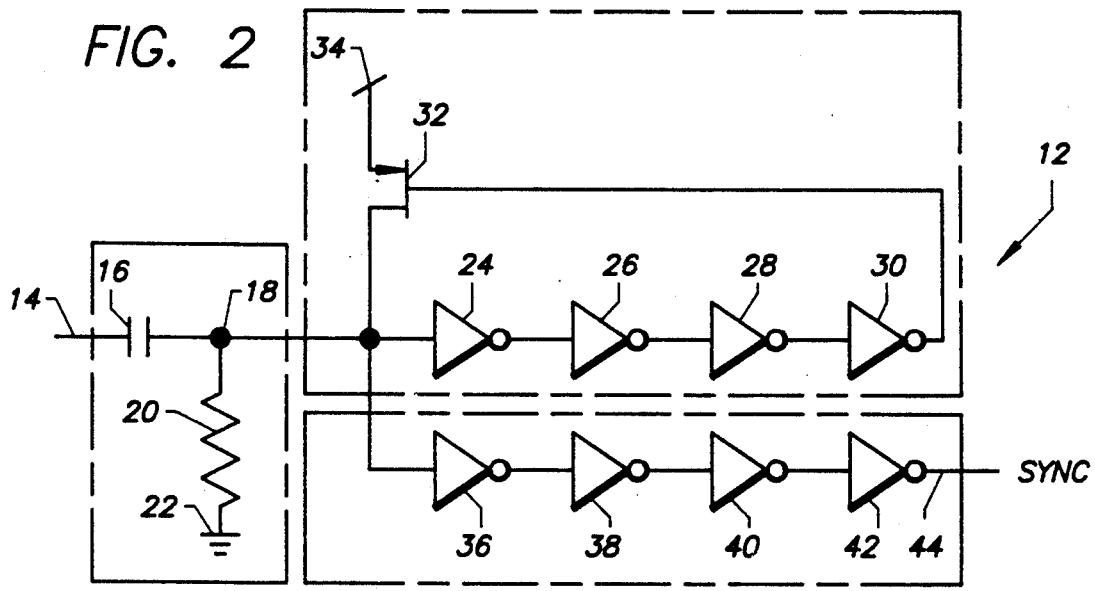
FIG. 2 is a circuit diagram of a system constituting one embodiment of the invention.
Figure 3:
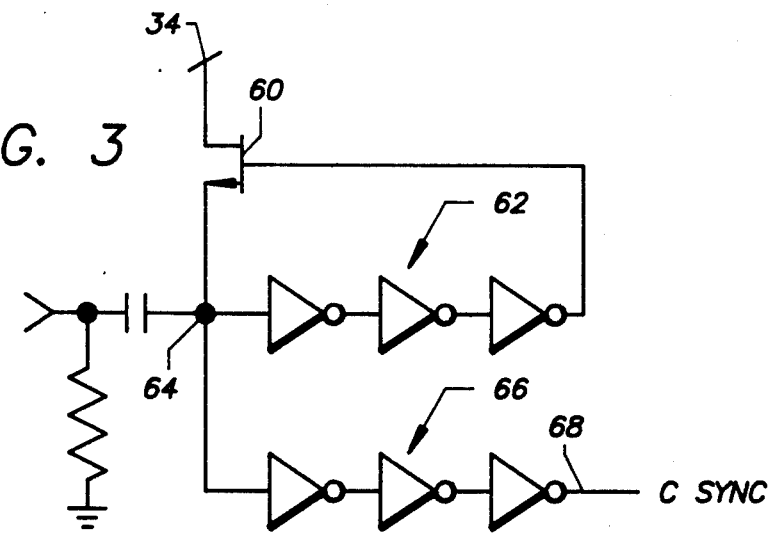
FIG. 3 is a circuit diagram of a system constituting another embodiment of the invention.
Figure 2A:
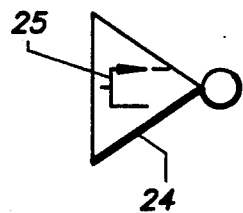
FIG. 2A is an enlarged block diagram of an inverter shown in FIG. 2 and of a transistor included in such inverter.
Figure 2B:
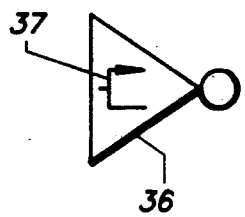
FIG. 2B is an enlarged block diagram of another inverter shown in FIG. 2 and of a transistor included in such inverter.

FIG. 3 illustrates an embodiment which employs an n type of transistor 60 in the feedback circuit rather than the p type of transistor 32 as in the embodiment shown in FIG. 2 and described above. When an n type of transistor such as the transistor 60 is used in the feedback circuit, an odd number of inverters generally illustrated at 62 is connected in series between a common terminal 64 and the gate of the transistor 60. Similarly, an odd number of inverters generally indicated at 66 is connected in series between the common terminal 64 and an output line 68. The system shown in FIG. 3 operates in substantially the same manner as the system shown in FIG. 2, but produces a positive sync pulse.

The embodiments shown in FIGS. 2 and 3 have certain advantages over the prior art. They do not include a precision comparator and accordingly do not have any problems of requiring precision components to construct the comparator in order to be accurate. The embodiments of this invention also do not have a second input terminal, as in the prior art, for receiving a reference voltage which also has to be precise. The embodiments of this invention accordingly avoid the disadvantages of the prior art.

The embodiments of this invention regulate the voltage to which the negative peak of the horizontal sync pulse is clamped at the terminal 18 in FIG. 2 and at the terminal 64 in FIG. 3. The embodiments also regulate the difference between this clamped voltage and the internal difference voltage of the inverter chains 36, 38, 40, 42 in FIG. 2 and 66 in FIG. 3. This small voltage difference is adjusted by controlling the characteristics of the transistors in the inverters 24 and 36 in FIG. 2 and the transistors in the corresponding inverters in FIG. 3. These characteristics may be precisely controlled by adjusting the widths of the N channel transistors in the CMOS pair.

The precise control of the characteristics of the transistors in the inverters 24 and 36 in FIG. 2 and the corresponding transistors in FIG. 3 can be enhanced by disposing the inverters 24, 26, 28 and 30 and the inverters 36, 38, 40 and 42 in FIG. 2, and the invertors 62 and 66 in FIG. 3, in an adjacent relationship on the integrated circuit chip 10. In this way, the characteristics of the transistors in the inverters are controlled substantially only by the dimensions of the transistors and not by any variations in the characteristics of the transistors separated by large distances on the chip 10.

The discussion above has been on the basis of detecting the presence of the horizontal sync pulse in a televisions receiver to distinguish the horizontal sync pulse from the color burst signals which follow the horizontal sync pulse in each line. It will be appreciated that the systems of this invention can also be used to provide precise images on the video screen of computers including personal computers and engineering work stations. Actually, the system of this invention can be used in systems completely unrelated to the generation of video images without departing from the scope of ths invention. For example, the systems of this invention can be used in any equipment where voltage pulses of somewhat precise amplitude of a particular polarity have to be detected in the presence of signals of nearly the same amplitude which must be rejected.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination, means for receiving an input voltage pulse, first inverter means responsive to voltages of at least a first particular magnitude, the first inverter means having an input terminal connected to receive the input voltage pulse and having an output terminal providing control pulses when the input voltage pulse has a magnitude with a particular relationship to a first particular magnitude, control means responsive to the control pulses from the output terminal of the first inverter means for maintaining the voltage at the input terminal of the first inverter means at the first particular magnitude when the magnitude of the input voltage pulse has the particular relationship to the first particular magnitude, and second inverter means having an input terminal common with the input terminal of the first inverter means and having an output terminal providing an output voltage pulse of a second particular magnitude when the magnitude of the voltage received at the input terminal of the second inverter means has the particular relationship to a voltage of a third particular magnitude, the third particular magnitude being greater than the first particular magnitude.

2. In a combination as set forth in claim 1 wherein the control means includes a transistor having first, second and third terminals and wherein the first terminal receives an energizing voltage and the second terminal receives the control pulses at the output terminal of the first inverter means and the third terminal provides the voltage to the input terminal of the second inverter means.

3. In a combination as set forth in claim 1, an integrated circuit chip, the receiving means for the input voltage pulse, the first and second inverter means and the control means being included in the integrated circuit chip, the first and second inverter means being included in adjacent relationship in the integrated circuit chip.

4. In a combination as set forth in claim 3 wherein the first inverter means includes a transistor dimensioned to define the voltage of the first particular magnitude and the second inverter means includes a transistor dimensioned to define the voltage of the third particular magnitude.

5. In a combination as set forth in claim 4 wherein each of the first and second inverter means includes at least one individual inverter and the transistor in the first inverter means is included in the at least one inverter in such first inverter means, and the transistor in the second inverter means is included in the at least one inverter in the second inverter means.

6. In a combination as set forth in claim 3, the first inverter means including a first transistor having a length and a width with dimensions to provide for the comparison in the magnitude of the input voltage pulse at the input voltage means with the voltage of the first particular magnitude to obtain the production by the control means of the voltage of the first particular magnitude when the input voltage has a magnitude less than the first particular magnitude and the second inverter means including a second transistor having a length and a width to provide for the comparison in the magnitude of the voltage at the input terminal of the second inverter means with the voltage of the second particular magnitude to obtain the production of the output voltage when the voltage at the input terminal of the second inverter means has a magnitude less than the voltage of the second particular magnitude.

7. In a combination as set forth in claim 6,
the input voltage pulse constituting a horizontal sync pulse and there being a plurality of color burst signals after the horizontal sync pulse and the output voltage pulse having an amplitude to distinguish the horizontal sync pulse from the color burst signals, and
the first inverter means including at least a first inverter which includes the first transistor,
the second inverter means including at least a second inverter which includes the second transistor.

8. In a combination as set forth in claim 1,
the control means being connected in a closed loop between the output terminal of the first inverter means and the input terminal of the first inverter means to regulate the voltage at the input terminal of the first inverter means at the first particular magnitude when the magnitude of the input voltage pulse is less than the first particular magnitude.

9. In a combination as set forth in claim 3,
the first inverter means including a first transistor having a first particular width to provide for the production of the voltage of the first particular magnitude by the control means when the input voltage has a magnitude less than the first particular magnitude,
the second inverter means including a second transistor having a second particular width to provide for the production of the output voltage of the third particular magnitude when the input voltage has a magnitude less than the third particular magnitude.

10. In combination,
means for receiving an input voltage pulse,
first means including a first terminal for comparing the input voltage pulse to a voltage of a first particular magnitude and for providing a control voltage dependent upon such comparison,
second means responsive to the control voltage for providing the voltage of the first particular magnitude at the first terminal when the input voltage pulse has a magnitude with a particular relationship relative to the voltage of eh first particular magnitude, and
third means including the first terminal for providing a comparison between the magnitude of the voltage at the first terminal and a voltage having a second particular magnitude greater than the first particular magnitude to provide an output voltage pulse of a third particular magnitude when the voltage at the first terminal has a particular relationship to the voltage of the second particular magnitude, the first means including a first transistor having dimensions to respond to voltages with the particular relationship to the first particular magnitude to obtain the production of the control voltage and the third means including a second transistor having dimensions to respond to voltages having the particular relationship to the second particular magnitude to obtain the production of the output voltage pulse.

11. In a combination as set forth in claim 10,
an integrated circuit chip,
the receiving means, the first means, the second means and the third means being included in the integrated circuit ship with the first means and the third means included in adjacent relationship in the integrated circuit chip.

12. In a combination as set forth in claim 10,
the second means including a closed loop servo responsive to the control voltage and connected to the first terminal for maintaining the voltage at the first terminal at the first particular magnitude when the magnitude of the input voltage pulse has the particular relationship to the first particular magnitude.

13. In a combination as set forth in claim 12,
an integrated circuit chip,
the receiving means, the first means, the second means and the third means being included in the integrated circuit chip with the first means and the third means in adjacent relationship in the integrated circuit chip.

14. In a combination as set forth in claim 10 wherein
the first transistor in the first means is provided with dimensions to provide the control voltage when the input voltage has a magnitude less than the first particular magnitude and wherein
the second transistor in the third means is provided with dimensions to obtain the production of the output voltage pulse when the voltage at the first terminal has a magnitude less than the second particular magnitude and wherein
the second particular magnitude is less than the first particular magnitude.

15. In combination,
means for receiving an input voltage pulse,
first means having only a single input terminal for producing a control voltage when the input voltage pulse has a a voltage with a particular relationship to a voltage of a first magnitude,
second means responsive to the control voltage for maintaining the voltage at the input terminal of the first means at the first magnitude when the input voltage pulse has the particular relationship the first magnitude, and
third means having only the single input terminal for receiving the voltage at the single input terminal of the first means and for producing an output voltage pulse of a particular magnitude when the voltage at the input terminal of the first means has the particular relationship to a voltage of a second magnitude.

16. In a combination as set forth in claim 15,
an integrated circuit chip,
the first means, the second means and the third means being included in the integrated circuit chip,
the first means and the third means being in adjacent relationship to each other in the chip, the first means including a first transistor having dimensions to provide for the production of the control voltage for input voltages having the particular relationship to the voltage of the first magnitude, the third means including a second transistor having dimensions to provide for the production of the output voltage of the particular magnitude when the voltage at the input terminal of the first means has the particular relationship to the voltage of the second magnitude.

17. In a combination as set forth in claim 16, the first and second transistors being in adjacent relationship in the integrated circuit chip.

18. In a combination as set forth in claim 17, the second means defining a closed loop servo with the first means and the single input terminal for maintaining the voltage at the single input terminal at the first magnitude when the input voltage pulse has the particular relationship to the voltage of the first magnitude.

19. In a combination as set forth in claim 15 wherein the first means is constructed to produce the control voltage when the input voltage pulse has a magnitude less than the first magnitude and wherein the third means is constructed to produce the output voltage pulse when the voltage at the input terminal has a magnitude less than the second magnitude and wherein the first magnitude is less than the second magnitude.

20. In combination, a common terminal, first means for introducing a voltage pulse to the common terminal, second means connected to the common terminal and defining a first voltage reference of a first particular magnitude and having an output terminal for producing at the output terminal a control voltage when the voltage pulse at the common terminal has a particular relationship to the first voltage reference of the first particular magnitude, third means responsive to the control voltage for providing a closed loop servo to the common terminal to maintain the first voltage reference of the first particular magnitude at the common terminal when the voltage at the common terminal has the particular relationship to the first voltage reference of the first particular magnitude, and fourth means connected to the common terminal and defining a second voltage reference of a second particular magnitude different from the first particular magnitude and having an output terminal for producing at the output terminal an output voltage having a particular magnitude when the voltage pulse at the common terminal has the particular relationship to the second voltage reference of the second particular magnitude.

21. In a combination as set forth in claim 20, an integrated circuit chip, the common terminal, the first means, the second means, the third means and the fourth means being included in the integrated circuit chip, the first and fourth means being provided with characteristics in the chip respectively to define the first and second voltage references of the first and second particular magnitudes, the first and fourth means being in adjacent relationship in the integrated circuit chip.

22. In a combination as set forth in claim 21 wherein the first means includes a first transistor having dimensions to define the first voltage reference of the first particular magnitude, and the fourth means includes a second transistor having dimensions to define the second voltage reference of the second particular magnitude.

23. In a combination as recited in claim 21 wherein the second means is constructed to produce the control voltage at the output terminal when the voltage pulse at the common terminal has a magnitude less than the first particular magnitude and wherein the fourth means is constructed to produce the output voltage of the particular magnitude when the voltage pulse at the common terminal has a magnitude less than the second particular magnitude and wherein the first particular magnitude is less than the second particular magnitude.

24. In combination, first means for providing a common terminal, second means for receiving an input voltage pulse and for introducing the input voltage pulse to the common terminal, third means having only a single input terminal, this input terminal being common with the common terminal, for comparing the input voltage pulse to a voltage of a first particular magnitude to provide a control voltage upon the occurrence of a first relationship between the input voltage pulse and the voltage of the first particular magnitude, fourth means responsive to the control voltage for regulating the voltage at the input terminal of the third means to the first particular magnitude when the input voltage pulse has the particular relationship to the voltage of the first particular magnitude, and fifth means having only a single input terminal, this terminal being common with the common terminal, for comparing the voltage at the common terminal with a voltage of a second particular magnitude to obtain the production of an output voltage pulse when the magnitude of the voltage at the common terminal has the particular relationship to the voltage of the second magnitude, the second particular magnitude being different from the first particular magnitude.

25. In a combination as set forth in claim 24, the input voltage pulse constituting a horizontal sync pulse and the output voltage pulse having a magnitude to distinguish it from color burst signals following the horizontal sync pulse, an integrated circuit chip, and the common terminal, the first means, the second means, the third means, the fourth means and the fifth means being included in the integrated circuit chip.

26. In a combination as set forth in claim 25, each of the third and fifth means including at least one inverter included in the integrated circuit chip, the at least one inverter in the third means being provided with characteristics to obtain the comparison of the input voltage pulse with the voltage of the first particular magnitude in the third means and at least one inverter in the fifth means being provided with characteristics to obtain the comparison of the voltage at the common terminal with the voltage of the second particular magnitude in the fifth means.

27. In a combination as set forth in claim 26, the at least one inverter in the third means including a first transistor defined by a width and a length in the integrated circuit chip to respond to the input voltage pulse to provide the control voltage when the input pulse is less than the first particular magnitude, the at least one inverter in the fifth means including a second transistor defined by a width and a length in the integrated circuit chip to respond to the voltage at the common terminal to obtain the production of the output voltage when the voltage at the common terminal is less than the second particular magnitude.

28. In combination, an integrated circuit chip, first means in the integrated circuit chip for providing an input voltage pulse, second means in the integrated circuit chip and including an input terminal, this being the only input terminal in such second means, for receiving the input voltage pulse and including means for comparing the input voltage pulse with a voltage of a first particular magnitude to obtain a regulated voltage of the first particular magnitude at the input terminal when the input voltage pulse has a magnitude less than the voltage of the first particular magnitude, and third means in the integrated circuit chip and including an input terminal common with the input terminal in the second means, this being the only terminal in the third means, for receiving the regulated voltage at the common input terminal, the third means being operative to produce an output voltage when the regulated voltage at the common terminal has a magnitude less than a voltage of a second particular magnitude greater than the first particular magnitude.

29. In a combination as set forth in claim 28, the third means being included in the integrated circuit chip in adjacent relationship to the second means.

30. In a combination as set forth in claim 28, the second means including a first transistor defined by a length and a width with dimensions to provide for the comparison in the magnitude of the input voltage pulse with the voltage of the first particular magnitude in the second means.

* * * * *